(12) United States Patent
Boskamp et al.

(10) Patent No.: US 6,563,315 B1
(45) Date of Patent: May 13, 2003

(54) GRADIENT COIL APPARATUS AND METHOD OF MICRO-IMAGING

(75) Inventors: Ed Benjamin Boskamp, Menomonee Falls, WI (US); Dinsie Belmont Williams, Waukesha, WI (US); John Edward Lorbiecki, Hubertus, WI (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 24 days.

(21) Appl. No.: 09/681,796

(22) Filed: Jun. 6, 2001

(51) Int. Cl.$^7$ .................................................. G01V 3/00
(52) U.S. Cl. ........................................ 324/318; 324/309
(58) Field of Search ................................. 324/318, 314, 324/307, 309; 128/633, 653

(56) References Cited

U.S. PATENT DOCUMENTS

| | | | |
|---|---|---|---|
| 5,153,516 A | * 10/1992 | Gopalsami et al. | 324/309 |
| 5,378,989 A | 1/1995 | Barber et al. | 324/309 |
| 5,570,021 A | 10/1996 | Dachniwskyj et al. | 324/309 |
| 5,760,584 A | 6/1998 | Frederick | 324/309 |
| 5,786,694 A | 7/1998 | Kilian et al. | 324/309 |
| 6,144,204 A | 11/2000 | Sementchenko | 324/309 |
| 6,160,399 A | 12/2000 | Radziun et al. | 324/309 |
| 6,242,915 B1 | * 6/2001 | Hurd | 324/309 |

* cited by examiner

Primary Examiner—Edward Lefkowitz
Assistant Examiner—Brij B. Shrivastav
(74) Attorney, Agent, or Firm—Ziolkowski Patent Solutions Group, LLC; Michael A. Della Penna; Carl B. Horton (57) ABSTRACT

A magnetic resonance imaging (MRI) apparatus and method for micro-imaging is provided. The apparatus comprises an MRI system having a gradient coil positioned within a bore of a magnet that impresses a polarizing magnetic field. The apparatus also includes an RF transceiver system, having an RF switch controlled by a pulse module, to transmit RF signals to an RF coil. Upon selection of a micro-imaging scan, a computer activates a micro-imaging gradient coil positioned within the bore of the magnet. The micro-imaging gradient coils are assembled such that, upon energization, substantially linear magnetic field gradients are created along three axes in a localized FOV adjacent to the micro-imaging gradient coils.

32 Claims, 6 Drawing Sheets

GRADIENT COIL APPARATUS AND METHOD OF MICRO-IMAGING

BACKGROUND OF INVENTION

The present invention relates generally to magnetic resonance imaging (MRI), and more particularly, to an apparatus and method to perform micro-imaging by switching from a whole-body set of gradient coils to a micro-imaging gradient coil.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed using gradient coils. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of gradient coils to generate a gradient field about the bore of a magnet for imaging is known in the art of nuclear magnetic resonance imaging. Generally, a patient is positioned on an examination table and inserted into a superconducting magnet having a cylindrical bore therethrough. The superconducting magnet provides the uniform magnetic field $B_0$ through the bore. The gradient coils extend around the bore and are energized to impose time varying magnetic fields on the uniform magnetic field.

While the use of gradient coils around the bore of the superconducting magnetic is practical during a whole-body imaging scan, it is not very efficient during micro-imaging of localized regions within a smaller field-of-view (FOV), such as the imaging of a finger. One of the problems with using whole-body gradient coils during micro-imaging is that the gradient fields extend through the bore of MRI device. The extension of the gradient fields over a large volume causes non-linearities in the gradient fields within the FOV. Another problem with whole-body gradient coils is dB/dt effects during imaging of human patients. Such dB/dt levels are regulated for patients under examination. That is, the speed at which the gradient coils are switched (i.e. ramped up and down) must be carefully monitored and controlled. These regulations limit the applied strength of the time-varying magnetic fields generated by the superconducting magnet and gradient coils during imaging.

It would therefore be desirable to have a device that provides substantially linear gradient magnetic fields during micro-imaging in a localized region or micro-FOV, that also decreases the amount of magnetic field gradient passing through a patient during a micro-imaging scan of the patient as compared to a whole-body imaging scan.

SUMMARY OF INVENTION

The present invention provides a local RF/gradient coil assembly and method of micro-imaging solving the aforementioned problems.

The invention includes the use of a magnet to produce a uniform background magnetic field for MR imaging of an object or anatomy in a localized region or micro-FOV. Upon selection of a micro-imaging scan, a computer activates a local RF/gradient coil assembly positioned within a bore of the magnet. The local RF/gradient coil assembly is configured such that, upon energization, substantially linear magnetic field gradients are created along three axes in a localized region or micro-FOV adjacent to the local RF/gradient coil.

In accordance with one aspect of the present invention, a device for micro-imaging includes a local RF/gradient coil assembly comprising a first gradient coil arranged to conduct current in opposite directions, a second gradient coil arranged to conduct current in one direction, and a third gradient coil arranged to conduct current in two planes. The first, second, and third coils are arranged to be electrically separated, and produce magnetic field gradients in different directions, such as along the axes of an x-y-z coordinate system. The first, second, and third coils are also positioned about one another to form a single local RF/gradient coil assembly.

In accordance with another aspect of the present invention, an MRI apparatus to acquire images includes a magnetic resonance imaging (MRI) system having a gradient coil positioned within a bore of a magnet to impress a polarizing magnetic field, and an RF transceiver system. The MRI system further includes an RF switch controlled by a pulse module to transmit RF signals to an RF coil mechanically connected to the gradient coil. The design of the gradient coil includes a first coil aligned along a first, or z, axis, and a second coil also aligned along the z-axis. The second coil is substantially positioned within the first coil. The gradient coil additionally includes a third coil having a plurality of bi-planar coils, wherein both the first and second coils are partially enclosed by the third coil. The first, second, and third coils are configured to provide a gradient magnetic field in different directions.

In accordance with yet another aspect of the present invention, a method of acquiring MR data from a localized region is disclosed comprising the steps of applying a uniform magnetic field to anatomy or an imaging object and locating the local gradient coil adjacent to a surface of a localized FOV of the imaging object. The localized FOV or micro-FOV is positioned in a region external to the local gradient coil. The method also includes the step of generating a substantially linear gradient over the localized FOV on three axes, such as x, y, and z of a three dimensional orthogonal coordinate system.

The invention further includes a micro-imaging gradient coil comprising a means for creating $dB_z/dz$, $dB_z/dy$, and $dB_z/dx$ gradients on a localized region or FOV. Each of the gradients are created in different directions, such as along the axes of a three dimension orthogonal coordinate system, and are superimposed over a background magnetic field. The invention further comprises a means for locating the micro-imaging gradient coil adjacent to a surface of the localized FOV of the imaging object, such that the localized FOV is positioned in a region external to the micro-imaging gradient coil.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
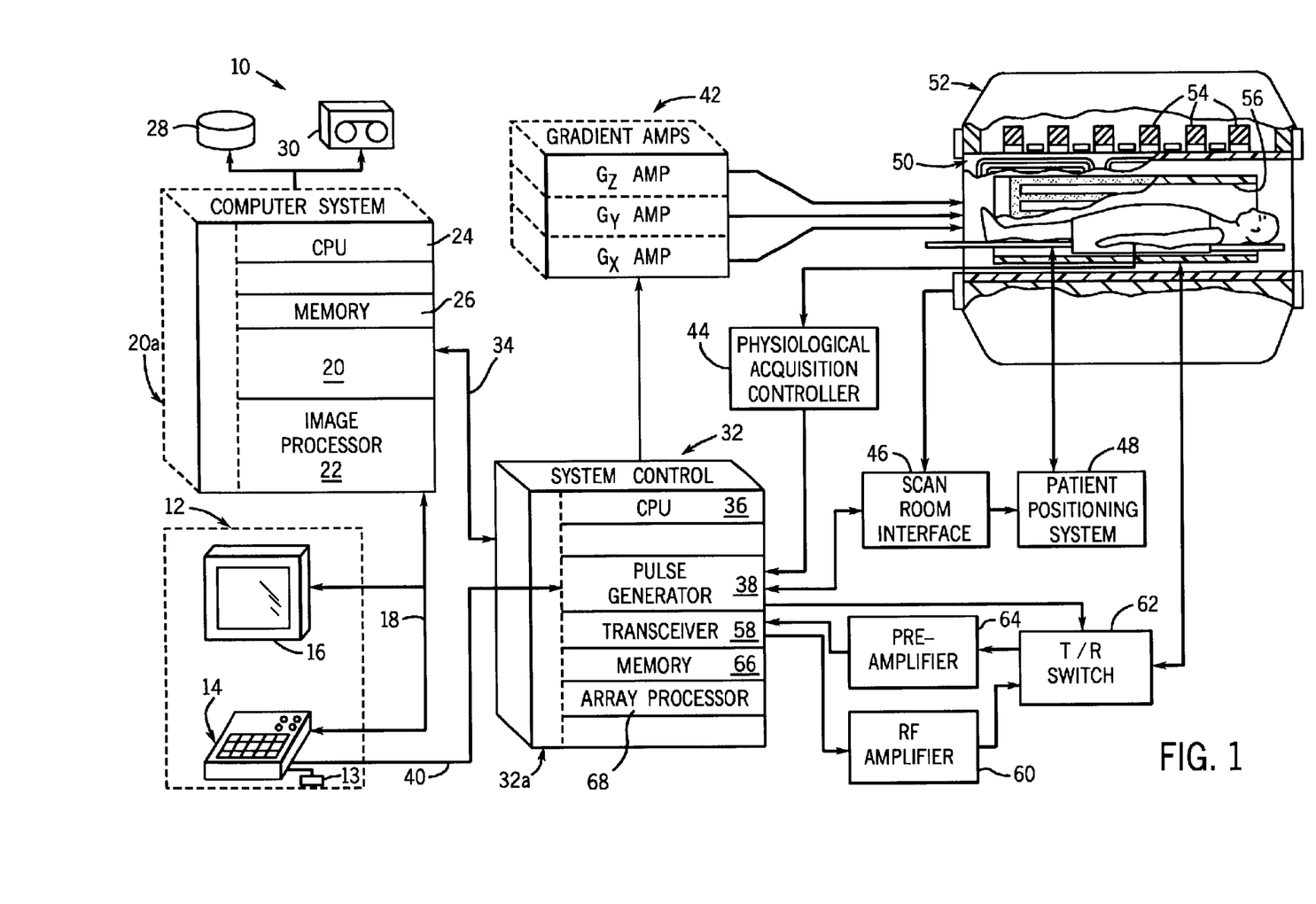
FIG. 1 is a block diagram of an MR system incorporating the present invention.

The embodiments of the present invention will now be described in more detail with reference to the accompanying drawings. Referring to FIG. 1, the major components of a preferred magnetic resonance imaging (MRI) system 10 incorporating the present invention are shown. The operation of the system 10 is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms a part of a magnet assembly 52 which includes a polarizing magnet 54 and a RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or a portion thereof and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
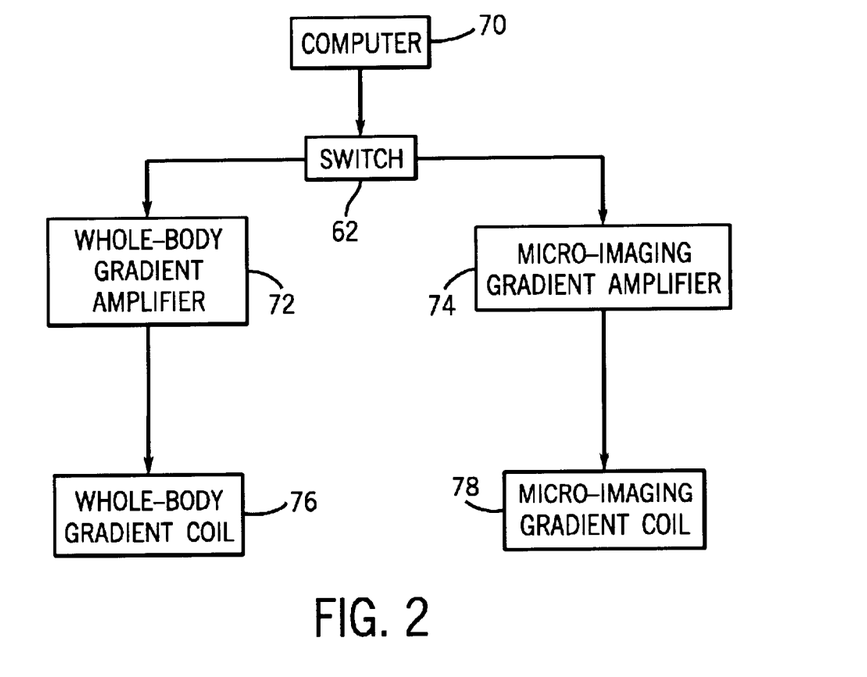
FIG. 2 is a block diagram further defining the configuration between the switch and gradient coil assembly of FIG. 1 in accordance with the present invention.

Referring now to FIG. 2, a block diagram further defining the configuration between transmit/receive switch 62 and gradient coil assembly 50 is shown. Switch 62 is shown connected to a general computer 70. Computer 70 can include operator console 12, computer system 20, disk storage 28, tape 30, control 32, physiological acquisition controller 44, scan room interface 46, patient positioning system 48, and amplifiers 60, 64 as described in FIG. 1. Computer 70 is designed to generate control signals, for specified FOV size inputs, that cause control 32 to switch power via switch 62 between a whole-body gradient amplifier 72 and a micro-imaging or localized gradient amplifier 74. Both the whole-body gradient amplifier 72 and the micro-imaging gradient amplifier 74 are connected to switch 62 and are capable of being separately activated. If the whole-body gradient amplifier 72 is activated, then one or more whole-body gradient coils 76 of the gradient coil assembly 50 are activated to perform a whole-body imaging scan in a known manner. The gradient magnetic fields generated are whole-body gradient magnetic fields similar to those used in standard magnetic resonance imaging devices. If computer 70 causes switch 62 to activate the micro-imaging or localized gradient amplifier 74, then localized gradient coil 78 is activated or energized providing a mechanism for small scale or micro-FOV imaging of an object or anatomy.

It is noted that the term "micro-imaging" is intended to describe a localized imaging process that is, generally speaking, less than that of whole-body imaging. The term is not intended to convey a "sub-millimeter" connotation. The structure of the local RF/gradient coil is such that it allows for acute imaging of a local, or sub-localized area that is generally not achievable with whole-body imaging.

The foregoing description is based on an x-y-z coordinate system. However, one skilled in the art will readily recognize that the invention is not so limited. Other coordinate systems can be substituted. Also, rotation, or partial rotation, of the components will result in an equivalent system.

Figure 3:
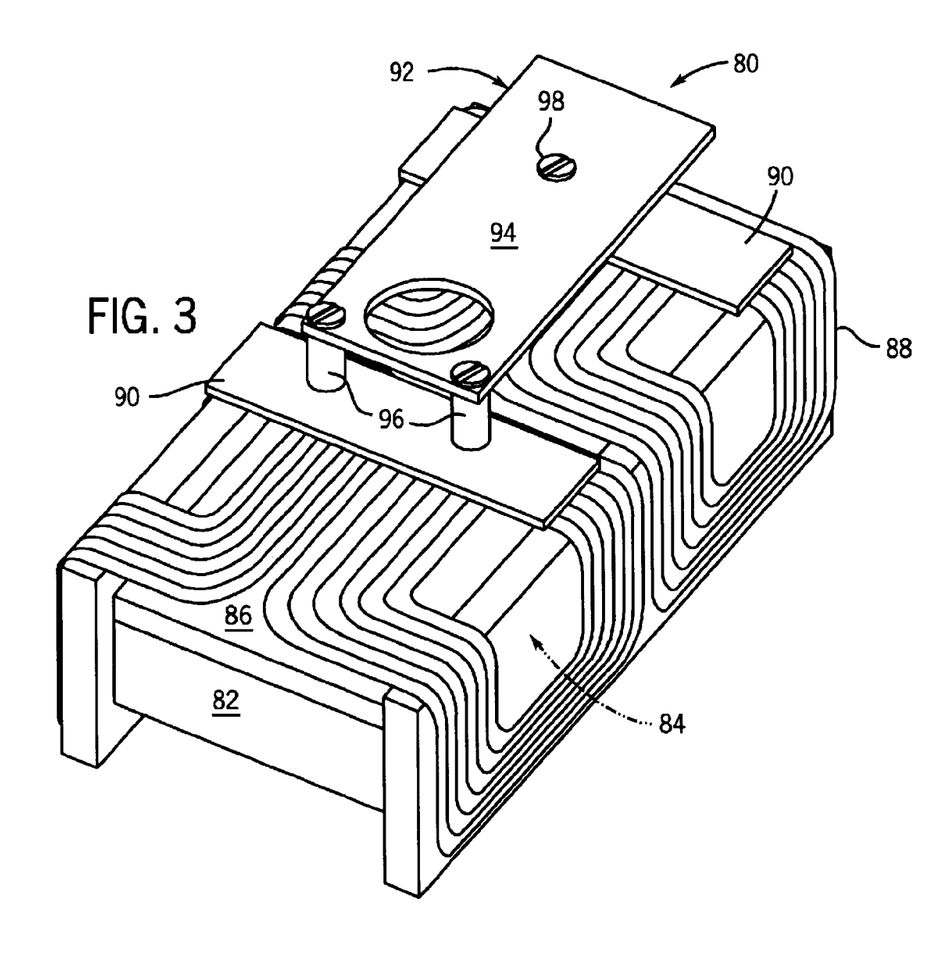
FIG. 3 is a perspective view of a micro-imaging gradient coil assembly in accordance with the present invention.

Referring now to FIG. 3, a perspective view of a micro-imaging device or local RF/gradient coil assembly 80 is shown, wherein activation of the device causes a micro-imaging scan of a localized region within a micro-FOV. The imaging volume within the micro-FOV is substantially less than a volume imaged by standard whole-body gradient coils 50 positioned around the bore of the magnet 52, and can be generally quite small, such as 1.0 cm.$^3$. The device or micro-imaging gradient coil 80 is a surface coil that is employed adjacent a surface of the anatomy of a patient to acquire images of a region of interest. The coil 80 however does not encircle the region of interest. The device 80 includes a housing 82 having an interior region 84 shown in phantom and an exterior region 86. An x-gradient coil 88 partially surrounds the housing 82 on three sides. Spacers 90 are secured to the x-gradient coil 88 to provide a level surface for attaching an RF coil platform 92 to the x-gradient coil 88. The RF coil platform 92 includes plate 94, supports 96, and screws 98 for attaching the plate 94 to the spacers 90. Supports 96 maintain a separation between the plate 94 and the spacers 90. The RF coil platform 92 is positioned adjacent to the x-gradient coil assembly 88 so that a localized region or FOV adjacent to the micro-imaging device 80 can be imaged.

Figure 4:
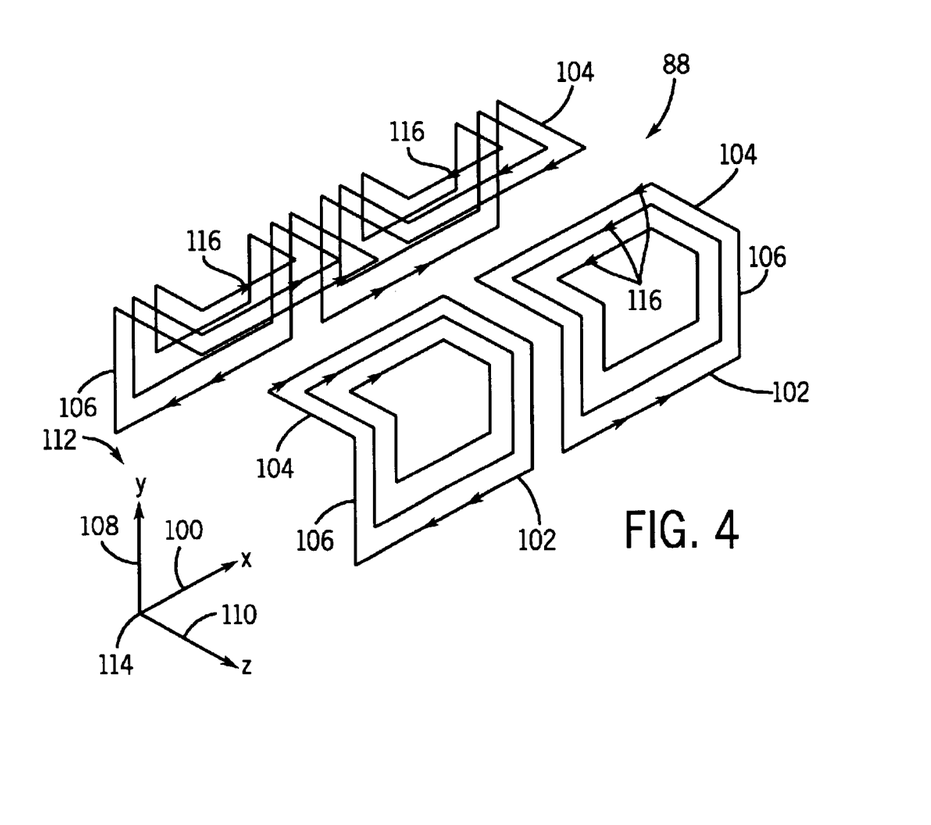
FIG. 4 is a perspective view of a schematic of an x-gradient coil in accordance with the present invention.

Referring now to FIG. 4, a perspective view of a schematic of the x-gradient coil assembly 88 is shown longitudinally-aligned along an x-axis 100. The x-gradient coil assembly 88 comprises a set of bi-planar loops 102, wherein each of the bi-planar loops 102 has an upper surface 104 and a side surface 106. The side surface 106 is substantially parallel to a y-axis 108 and the upper surface 104 is substantially parallel to a z-axis 10. The upper and side surfaces 104, 106 are positioned at an approximate right angle to one another. The x, y, and z-axes 100, 108, 110 combine to form an orthogonal coordinate system 112 having an origin 114. Each of the bi-planar loops 102 may be interconnected via leads (not shown) or independently driven from micro-imaging gradient amplifier 74. Arrowheads 116 indicate the direction of electrical current flow in the x-gradient coil assembly 88 during device activation. The x-gradient coil assembly 88 is arranged to conduct current in two planes to generate a $dB_z/dx$ gradient magnetic field. In an alternative embodiment, the x-gradient coil 88 can comprise a plurality of bi-planar coils 102, each having a plurality of loops and arranged such that current flow-in one-half of the bi-planar coils 102 opposes current flow in another one-half of the bi-planar coils.

Figure 5:
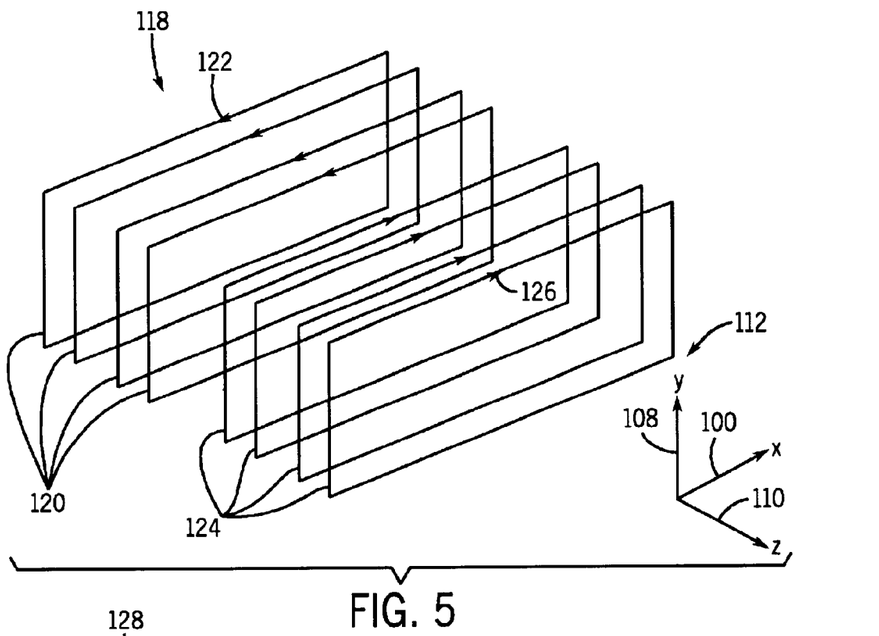
FIG. 5 is a perspective view of a schematic of a z-gradient coil in accordance with the present invention.

FIG. 5 shows a schematic of a z-gradient coil assembly 118. The z-gradient coil assembly 118 is aligned along z-axis 110 and electrically driven from the micro-imaging gradient amplifier 74. A first series of loops 120, upon activation of the z-gradient coil assembly 118, carries electrical current in the same uniform direction as indicated by arrowheads 122. A second series of loops 124 of the z-gradient coil assembly 118, upon activation, has electric current flow with orientation in a different direction, or opposite to that of the first series of loops 120, as indicated by arrowheads 126 to generate a $dB_z/dz$ gradient magnetic field. It is understood, that the distance between the loops controls the linearity of the gradient coil.

Figure 6:
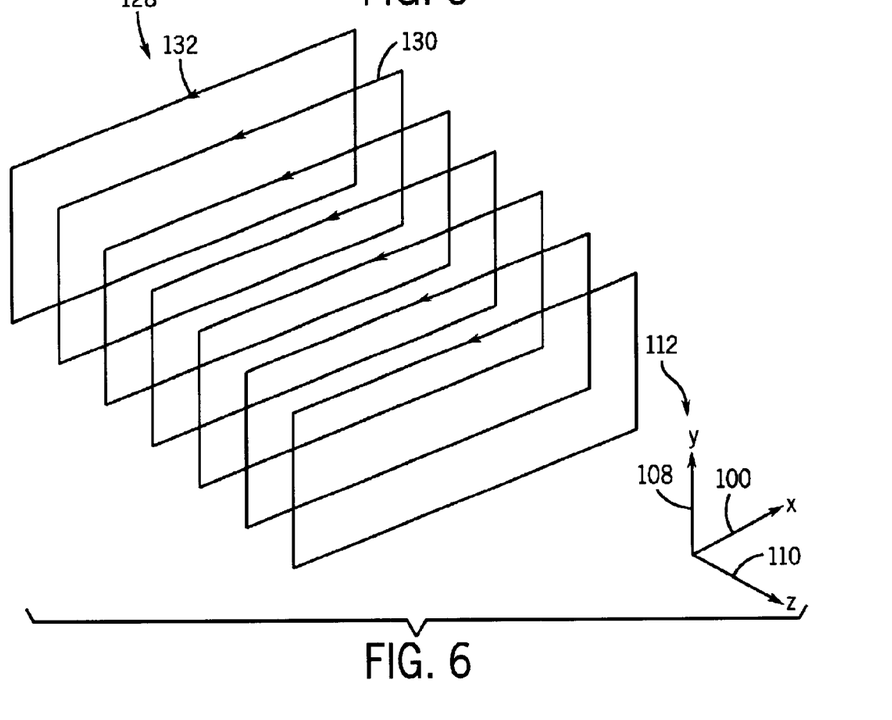
FIG. 6 is a perspective view of a schematic of a y-gradient coil in accordance with the present invention.

FIG. 6 is a schematic of a y-gradient coil assembly 128 of the device of FIG. 3. Upon activation by the micro-imaging gradient amplifier 74, electrical current in the y-gradient coil assembly or second set of coils 128 flows around each of the plurality of loops 130 in a uniform direction as indicated by arrowheads 132 to generate a $dB_z/dy$ gradient magnetic field. In an alternative embodiment, the plurality of loops 130 can be evenly displaced from one another.

Figure 7:
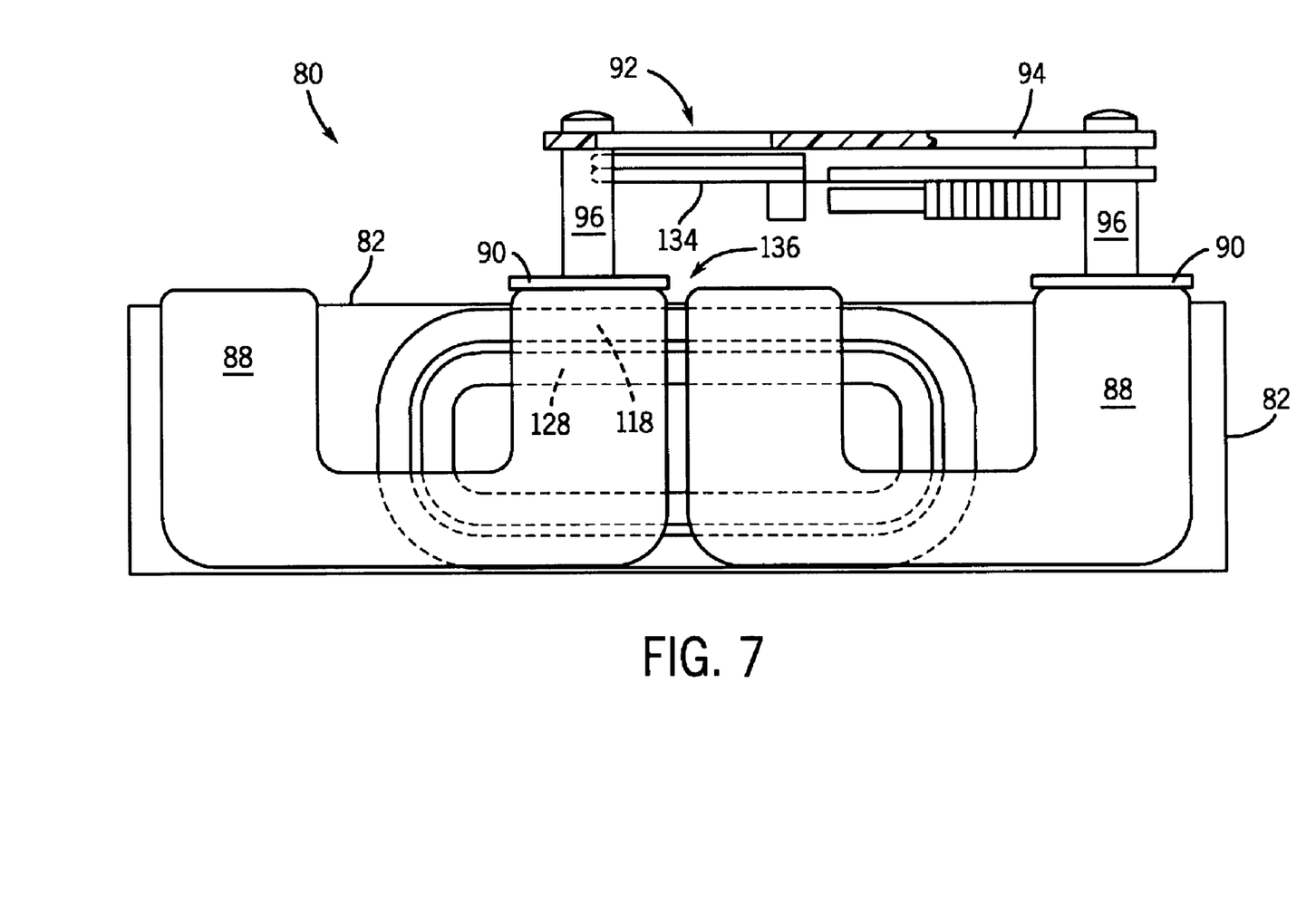
FIG. 7 is a side view of the micro-imaging gradient coil assembly of FIG. 3.

Referring now to FIG. 7, a side view of the micro-imaging device 80 shows the arrangement of the y-gradient coil assembly 128 and z-gradient coil assembly 118, partially in phantom, in the housing 82. An RF coil 134 adjacent to the x-gradient coil 88 is secured to a plate 94 of the RF coil platform 92. The RF coil platform 92 suspends the RF coil 134 above the x-gradient coil 88 of the housing 82. Supports 96 are of a sufficient length to prevent the RF coil 134 from contacting the x-gradient coil 88. During activation of the device or gradient coil 80, a substantially linear magnetic field gradient is created for micro-imaging in an imaging volume adjacent to the gradient coil 80 on an upper side 136. The imaging volume is also proximate to the RF coil platform 92. Preferably, the housing 82 is constructed from a non-conducting material to prevent electric current flow via induction between the x, y, and z-gradient coil assemblies 88, 128, 118.

One preferred embodiment will now be described in detail. The device 80, excluding the RF coil platform 92, has dimensions of 14.6 centimeters (cm.)×5.2 cm.×8.4 cm. in the x, y, and z-axes 100, 108, 110, respectively. The size of such a device is theoretically only limited by practical considerations. That is, for example, the size may be limited by the physical dimensions of the magnet bore and patient size. The device includes first 118, second 128, and third 88 gradient coil subassemblies positioned about one another to form a single local RF coil assembly 80. When activated by the RF transceiver 58, the first gradient coil 118 creates a $dB_z/dz$ gradient, the second gradient coil 128 creates a $dB_z/dy$ gradient, and the third gradient coil 88 creates a $dB_z/dx$ gradient. The device 80 includes a first or z-gradient coil 118 having a 6 cm.×3.2 cm.×6 cm. solenoid, which is wrapped around the y-gradient coil 128 such that the y-gradient coil 128 is arranged substantially within the z-gradient coil 118. The z-gradient coil 118 is formed from AWG-18 insulated copper wire having a 1 mm. diameter. The z-gradient coil 118 has 12 loops 120 carrying current in the same direction 122 as the y-gradient coil 128 and 12 loops 124 carrying current in the opposite direction 126. The loops 120, 124 are aligned along the z-axis 110. The z-gradient coil 118 has a 0.8 cm. spacing between loops 120 and loops 124 and provides a $dB_z/dz$ of approximately 3.54 mT/m/A upon activation. In an alternative embodiment, the z-gradient coil 118 comprises a first and second series of loops 120, 124 arranged in pairs, wherein the first and second series of loops 120, 124 are spaced further apart than pairs of the first and second series of loops 120, 124.

This preferred device 80 also includes a second or y-gradient coil 128 comprising a 6 cm.×3 cm.×6 cm. solenoid with respect to the x, y, and z-axes. The y-gradient coil 128 has 50 loops 130 wrapped around a supporting frame (not shown) of the housing 82. The supporting frame can include any structure capable of maintaining the looped structure of the y-gradient coil 128, such a rectangular bar attached to the housing 82 and positioned within the loops 130. The loops 130 are aligned with the z-axis 110, and are formed from the same insulating copper wire as the z-gradient coil 118. Upon activation, the y-gradient coil 128 is arranged to carry current in one direction 132 and produces a $dB_z/dy$ value of approximately 3.28 mT/m/A.

This one preferred device 80 further includes a third or x-gradient coil 88 comprising four bi-polar loops 102 arranged such that a gradient surface is formed by one side of each of the bi-planar loops 102. Each of the bi-polar loops 102 are arranged to conduct current in two planes, and comprises 16 wire loops. The loops 102 are formed of the same insulating copper wire as the other coils 118, 128. Each half of the loops 102 have dimensions of 6 cm.×4.5 cm.×2.9 cm. along the x, y, and z-axes 100, 108, 110, respectively. The bi-polar loops 102 have a 0.2 cm. separation between one another along the z-axis 110, and a 1.0 cm. separation along the x-axis 100. The x-gradient coil 88 is secured to an outer or exterior surface 86 of the housing 82, and is electrically separated from the y and z-gradient coil assemblies 128, 118, which are also electrically separated from one another. The x-gradient coil 88 partially encloses the y and z-gradient coil assemblies 128, 118, and produces a $dB_z/dx$ of approximately 4.57 mT/m/A upon activation. The side surfaces 106 of the x-gradient coil 88 are in alignment with the x-y plane and are perpendicular to the z-axis 110, and the upper surfaces 104 are in alignment with the x-z plane and perpendicular to the y-axis 108.

Preferably, the RF coil 134 has a 2.0 cm. diameter and is comprised of two loops of 14 AWG copper wire. The resonant frequency of this RF coil 134 is 63.86 MHz for a 1.5T magnet. Although a housing 82 has been included in the preferred embodiment, it is contemplated that the housing may be eliminated if the coils 88, 118, 128 are glued together, formed with stronger wires, or have other support structures capable of maintaining the desired coil shapes. Additionally, the RF shield commonly used in whole-body imaging scans is not necessarily required because there is no coupling of the RF energy into the gradient coil since the RF coil is straddled in the center of all three gradient coils.

It will be understood by those skilled in this art, that the invention is not limited to single layer windings for any of the aforementioned coils. These coils may equivalently be wound with multiple layers of windings.

Figure 8:
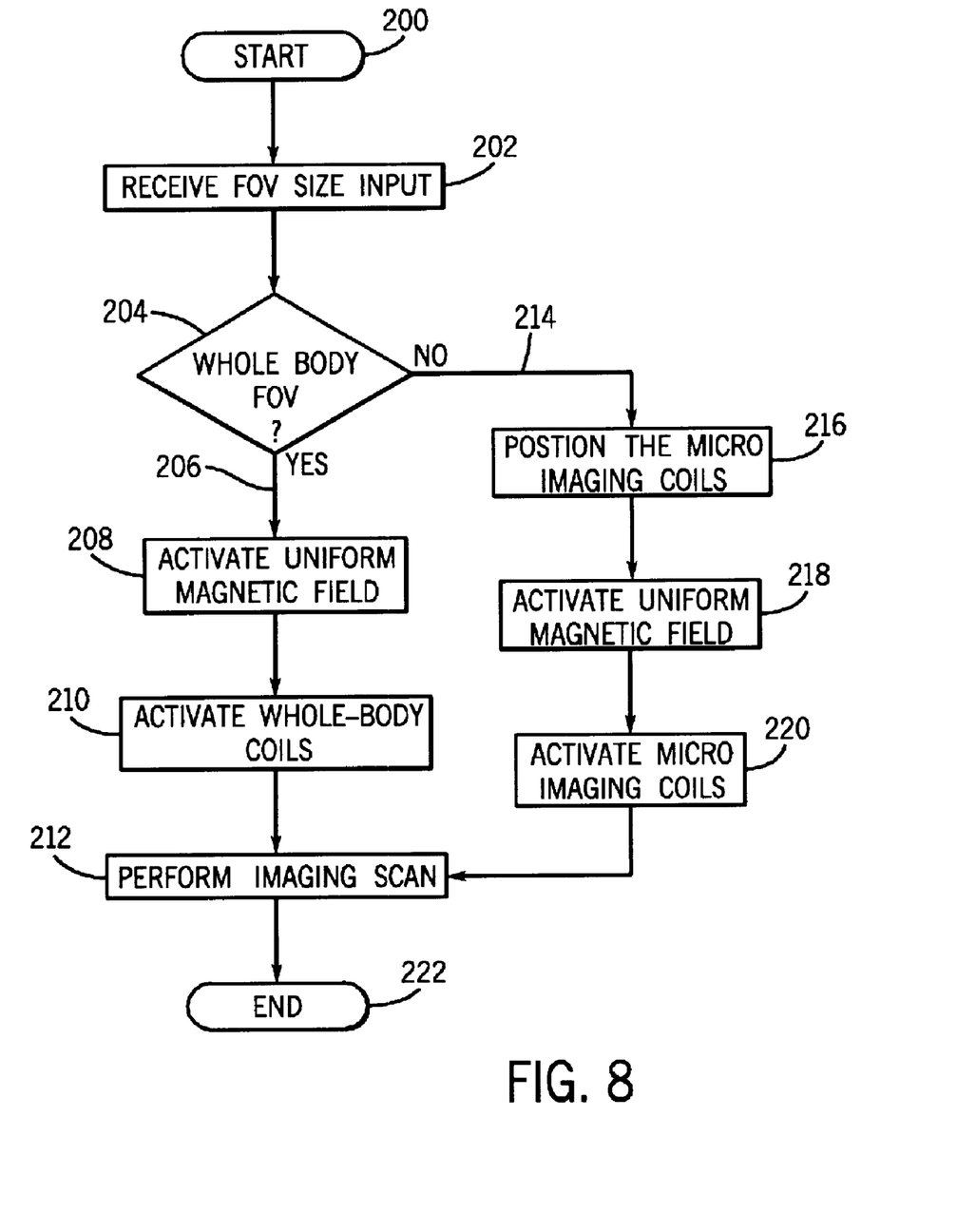
FIG. 8 is a flow chart showing a process to control the gradient coil assembly of FIG. 3 implemented in the system of FIG. 1.

FIG. 8 is a flow chart of a technique initiated at 200 for controlling activation of a plurality of gradient coils comprising a whole-body gradient coil and a micro-imaging gradient coil. An FOV size input is received 202 from data entered into the operator console. A determination is then made of whether a whole-body FOV imaging scan or a localized scan is desired 204. If a whole-body FOV is desired 206, then a uniform background magnetic field is activated 208 for aligning the nuclei spins. The whole-body gradient coil 210 is then activated for imaging of a patient in the desired FOV 212.

If however, the FOV size desired is a localized micro-image 204, 214, then the micro-imaging device is positioned such that the anatomy or localized region desired to be imaged is in an x-z plane adjacent the coil assembly within a micro-FOV 216. A uniform background magnetic field is activated 218 and the micro-imaging coils 220 are energized so as to perform a micro-imaging scan 212.

Regardless of whether the FOV size is determined as a whole-body or a micro-image, after performing the imaging scan 212 the method ends at 222 where the images can then be reconstructed. Generally, in order to perform the imaging scan 212, it is necessary to activate the whole-body coil 210 or the micro-imaging coil 220 on a repetitive basis in order to collect sufficient data for reconstruction of an image of the localized region or anatomy.

Generally referring to FIG. 1, in operation, if a whole-body imaging scan is desired, a patient is placed inside the coil assembly 56 by the patient positioning system 48 such that the region desired to be scanned is within a designated FOV near the x-gradient coil 88. The RF coil assembly 56 is configured to polarize, excite, and encode data in an imaging volume to reconstruct an image. If a micro-image scan is desired, then the micro-imaging coil 78 is positioned at the desired localized region such that the plate 94 of the RF coil platform 92 is adjacent the localized region. Magnet assembly 52 is then activated to produce the uniform background magnetic field, and the micro-imaging gradient coil 78 is repetitiously activated to perform the imaging scan. Data collected from the imaging scan is then used to reconstruct an image of the localized region or anatomy.

In accordance with one aspect of the present invention, a device for micro-imaging includes a local RF/gradient coil assembly comprising a first gradient coil arranged to conduct current with orientation in opposite directions, a second gradient coil arranged to conduct current with orientation in a common direction, and a third gradient coil arranged to conduct current with orientation in two planes. The coils are arranged to produce magnetic field gradients in different directions and are positioned about one another to form a single local RF/gradient coil assembly.

In accordance with another aspect of the present invention, an MRI apparatus to acquire images includes a magnetic resonance imaging (MRI) system having a gradient coil positioned within a bore of a magnet to impress a polarizing magnetic field and an RF transceiver system and an RF switch controlled by a pulse module to transmit RF signals to an RF coil mechanically connected to the gradient coil. The design of the gradient coil includes a first coil aligned along a first axis, a second coil also aligned along the first axis and positioned substantially within the first coil, and a third coil having a plurality of bi-planar coils. Each of the first, second, and third coils provide a different gradient magnetic field.

In accordance with yet another aspect of the present invention, a method of acquiring MR data from a localized region is disclosed comprising the steps of applying a uniform magnetic field to an imaging object and locating the local gradient coil adjacent to a surface of a localized FOV of the imaging object. The imaging object may include any object capable of being micro-imaged, such as a mouse, finger, etc. The localized FOV is positioned in a region external to the local gradient coil. The method also includes the step of generating a substantially linear gradient over the localized FOV on three axes, which requires forming first, second, and third gradient coil subassemblies to produce dBz/dy, dBz/dz, and dBz/dx gradients.

The invention further includes a micro-imaging gradient coil comprising a means for creating $dB_z/dz$, $dB_z/dy$, and a $dB_z/dx$ gradients on a localized FOV. Each of the gradients are created in different directions and are superimposed over a background magnetic field. The invention further comprises a means for locating the micro-imaging gradient coil adjacent to a surface of a localized FOV of the imaging object, such that the localized FOV is positioned in a region external to the micro-imaging gradient coil.

The present invention has been described in terms of the preferred embodiment, and it is recognized that equivalents, alternatives, and modifications, aside from those expressly stated, are possible and within the scope of the appending claims.

What is claimed is:

1. A local gradient coil assembly comprising:
   a first gradient coil arranged to conduct current in opposite directions;
   a second gradient coil arranged to conduct current in one direction;
   a third gradient coil arranged to conduct current in two planes; and
   wherein the first, second, and third gradient coils are positioned about one another to form a single local gradient coil assembly.

2. The coil assembly of claim 1 wherein the first gradient coil creates a $dB_z/dz$ gradient, the second gradient coil creates a $dB_z/dy$ gradient, and the third gradient coil creates a $dB_z/dx$ gradient, when activated by an gradient amplifiers.

3. The coil assembly of claim 1 wherein the single local gradient coil assembly is a surface coil that is used adjacent a surface of a patient to acquire images of a region of interest.

4. The coil assembly of claim 1 wherein the second gradient coil is arranged substantially within the first gradient coil, and the third gradient coil is arranged about three sides of the first gradient coil.

5. The coil assembly of claim 1 wherein the third gradient coil comprises a set of four bi-planar loops arranged such that a gradient surface is formed by one side of each of the bi-planar loops.

6. The coil assembly of claim 1 wherein the first gradient coil is arranged such that current orientation reverses at isocenter, and the second gradient coil is arranged such that current orientation is maintained throughout.

7. The coil assembly of claim 1 incorporated into an MR system without requiring a separate RF shield due to a relative small size of the coil assembly.

8. The coil assembly of claim 1 wherein the first gradient coil comprises a first and second series of loops arranged in pairs, wherein the first and second series of loops are spaced further apart than pairs of the first and second series of loops; and
   wherein the second gradient coil comprises a plurality of loops evenly displaced from one another.

9. The coil assembly of claim 1 wherein the third gradient coil comprises a plurality of bi-planar coils, each having a plurality of loops and arranged such that current flow in one-half of the bi-planar coils opposes current flow in another one-half of the bi-planar coils.

10. The coil assembly of claim 1 wherein the first gradient coil is a z-gradient coil, the second coil is a y-gradient coil, and the third coil is an x-gradient coil.

11. The coil assembly of claim 1 wherein activation of the device causes a micro-imaging scan of a localized region within a micro-FOV.

12. The coil assembly of claim 1 further comprising:
    an RF coil platform connected to the third gradient coil; and
    an RF coil adjacent to the third gradient coil and connected to the RF coil platform.

13. An MRI apparatus to acquire images comprising:
    a magnetic resonance imaging (MRI) system having a gradient coil positioned within a bore of a magnet that impresses a polarizing magnetic field and an RF transceiver system and an RF switch controlled by a pulse module to transmit RF signals to an RF coil connected to the gradient coil, the gradient coil further comprising:
    a first coil aligned along a first axis;
    a second coil aligned along the first axis and positioned substantially within the first coil;
    a third coil having a plurality of bi-planar coils; and
    wherein the first, second, and third coils each provide a different gradient magnetic field.

14. The MRI apparatus of claim 13 wherein the imaging volume is substantially less than a volume imaged by gradient coils positioned around the bore of the magnet.

15. The MRI apparatus of claim 13 wherein the gradient coil is a surface coil that is used adjacent a surface of a patient to acquire images of a region of interest and wherein the gradient coil does not encircle the region of interest.

16. The MRI apparatus of claim 13 wherein activation of the gradient coil causes the creation of a substantially linear magnetic field gradient for micro-imaging in an imaging volume adjacent to the gradient coil.

17. The MRI apparatus of claim 13 wherein the first coil creates a $dB_z/dz$ gradient, the second coil creates a $dB_z/dy$ gradient, and the third coil creates a $dB_z/dx$ gradient when activated by an RF transceiver.

18. The MRI apparatus of claim 13 wherein the first coil is a z-gradient coil arranged to conduct current in more than one direction, the second coil is a y-gradient coil arranged to conduct current one direction, and the third coil is an x-gradient coil arranged to conduct current in two planes.

19. The MRI apparatus of claim 18 having dimensions less than 15 cm.×6 cm.×9 cm.

20. The MRI apparatus of claim 19 wherein the anatomy imaged is within an FOV as small as 1.0 cm.

21. The MRI apparatus of claim 13 wherein the imaging volume is proximate to an RF coil platform connected to the RF coil.

22. A method of acquiring MR data from a localized region comprising the steps of:
    applying a uniform magnetic field to an imaging object;
    locating a local gradient coil adjacent to a surface of a localized FOV of the imaging object, such that a plurality of gradients are focused away from the local gradient coil; and
    generating a substantially linear gradient over the localized FOV on three axes.

23. The method of claim 22 wherein the step of generating a substantially linear gradient over the localized FOV on the three axes further includes:
    forming a first gradient coil subassembly to produce a dBz/dz gradient;
    forming a second gradient coil subassembly to produce a dBz/dy gradient; and
    forming a third gradient coil subassembly to produce a dBz/dx gradient.

24. The method of claim 23 further including the steps of:
    conducting current through the first gradient coil subassembly with orientation in opposite directions;
    conducting current through the second gradient coil subassembly with orientation in a common direction; and
    conducting current through the third gradient coil subassembly in two planes.

25. The method of claim 23 wherein the forming of the first, second, and third gradient coil subassemblies includes:
    constructing the first gradient coil subassembly as a first plurality of loops, each capable of conducting current such that current flow is in opposed directions;

constructing the second gradient coil subassembly as a second plurality of loops, each capable of conducting current in a common direction; and constructing the third gradient coil subassembly as a plurality of bi-planar loops, each capable of conducting current such that current flow in one-half of the bi-planar loops opposes current flow in another one-half of the bi-planar loops.

26. The method of claim 23 wherein the forming of the first, second, and third gradient coil subassemblies includes:

forming the first gradient coil subassembly as a first plurality of loops about a z-axis;

forming the second gradient coil subassembly as a second plurality of loops in alignment with the z-axis and positioned substantially within the first gradient coil subassembly; and forming the third gradient coil subassembly as a set of four bi-planar loops arranged such that a gradient surface is formed by one side of each of the bi-planar loops.

27. The method of claim 22 wherein the local gradient coil is a surface coil that does not encircle a region of interest to be scanned.

28. A micro-imaging gradient coil comprising:

means for creating a $dB_z/dz$ gradient on a localized FOV;

means for creating a $dB_z/dy$ gradient on the localized FOV;

means for creating a $dB_z/dx$ gradient on the localized FOV; and means for locating the micro-imaging gradient coil adjacent to a surface of the localized FOV of the imaging object, such that the localized FOV is positioned in a region external to the micro-imaging gradient coil.

29. The gradient coil of claim 28 wherein the micro-imaging gradient coil is a surface coil that is employed adjacent a surface of anatomy to acquire images of a region of interest and wherein the micro-imaging gradient coil does not encircle the region of interest.

30. The gradient coil of claim 28 wherein the means for creating a $dB_z/dy$ gradient in the localized FOV constructing the second gradient coil as a second plurality of loops arranged to conduct current in one direction.

31. The gradient coil of claim 28 wherein the means for creating a $dB_z/dx$ gradient in the localized FOV constructing the third gradient coil as a plurality of bi-planar loops, each capable of conducting current such that current flow in one-half of the bi-planar loops opposes current flow in another one-half of the bi-planar loops.

32. The gradient coil of claim 28 wherein the means for creating a dBz/dz gradient in a localized FOV includes constructing the first gradient coil as a first plurality of loops arranged to conduct current in opposed directions.

* * * * *

UNITED STATES PATENT AND TRADEMARK OFFICE
CERTIFICATE OF CORRECTION

PATENT NO. : 6,563,315 B1
DATED : May 13, 2003
INVENTOR(S) : Boskamp et al.

It is certified that error appears in the above-identified patent and that said Letters Patent is hereby corrected as shown below:

Column 10,
Line 33, delete "1.0 cm" and substitute therefor -- $1.0^3$ cm --;

Signed and Sealed this

Eighth Day of July, 2003

JAMES E. ROGAN
*Director of the United States Patent and Trademark Office*